(12) United States Patent
Li

(10) Patent No.: US 6,972,379 B2
(45) Date of Patent: Dec. 6, 2005

(54) CIRCUIT BOARD AND A METHOD FOR MAKING THE SAME

(75) Inventor: Delin Li, San Jose, CA (US)

(73) Assignee: Visteon Global Technologies, Inc., Dearborn, MI (US)

( * ) Notice: Subject to any disclaimer, the term of this patent is extended or adjusted under 35 U.S.C. 154(b) by 1069 days.

(21) Appl. No.: 09/814,486

(22) Filed: Mar. 20, 2001

(65) Prior Publication Data

US 2001/0036064 A1 Nov. 1, 2001

Related U.S. Application Data

(60) Provisional application No. 60/207,647, filed on May 26, 2000.

(51) Int. Cl.[7] .............................. H05K 1/11; H05K 3/40
(52) U.S. Cl. ....................... 174/255; 174/259; 174/261; 174/262; 29/830; 29/846; 29/852
(58) Field of Search ................................. 361/778, 780, 361/792–795, 805; 174/250, 253, 255, 261, 262, 259; 428/209, 210, 901; 257/276, 522, 776; 438/619; 29/830, 831, 846, 852; 156/151

(56) References Cited

U.S. PATENT DOCUMENTS

| | | | |
|---|---|---|---|
| 3,801,388 A | | 4/1974 | Akiyama et al. |
| 4,000,054 A | * | 12/1976 | Marcantonio ................ 174/256 |
| 4,118,595 A | * | 10/1978 | Pfahnl et al. ................ 174/256 |
| 4,141,055 A | * | 2/1979 | Berry et al. ................. 174/253 |
| 4,404,059 A | | 9/1983 | Livshits et al. |
| 4,899,439 A | * | 2/1990 | Potter et al. ................. 174/255 |
| 4,920,639 A | * | 5/1990 | Yee ............................ 174/261 |
| 5,117,276 A | * | 5/1992 | Thomas et al. ................ 216/15 |
| 5,738,797 A | | 4/1998 | Belke, Jr. et al. |
| 5,798,559 A | * | 8/1998 | Bothra et al. ................ 257/508 |
| 6,160,715 A | * | 12/2000 | Degani et al. ............... 257/723 |
| 6,217,783 B1 | * | 4/2001 | Goenka et al. ................ 216/15 |

* cited by examiner

Primary Examiner—John B. Vigushin

(57) ABSTRACT

A method 10 for making a multi-layer electronic circuit board 110 having electroplated apertures 18, 20 which may be selectively and electrically isolated from electrically grounded member 12 and further having selectively formed air bridges and/or crossover members 50 which are structurally supported by material 54, and further having certain exposed connection surfaces 112, selectively and electrically connected to certain electrically conductive members 34, 42, and 44.

18 Claims, 4 Drawing Sheets

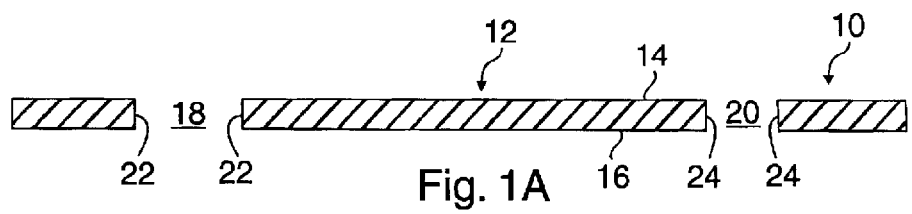
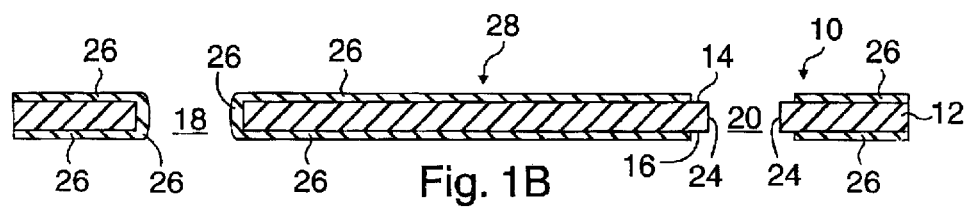
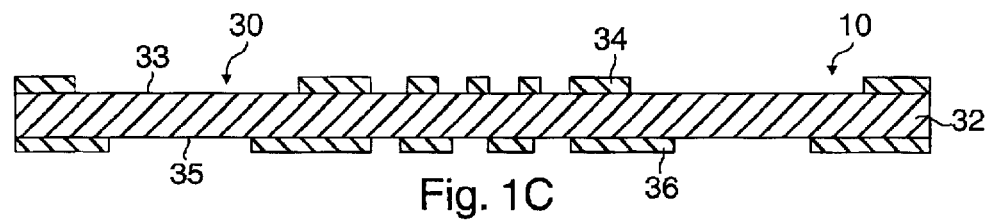
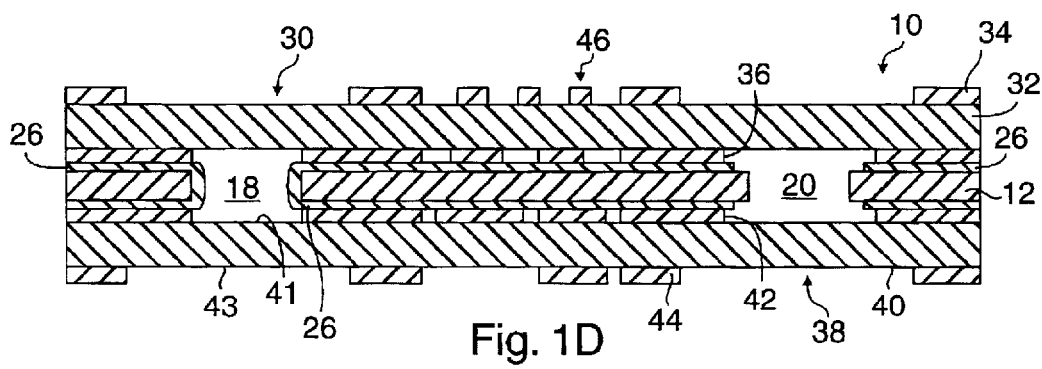
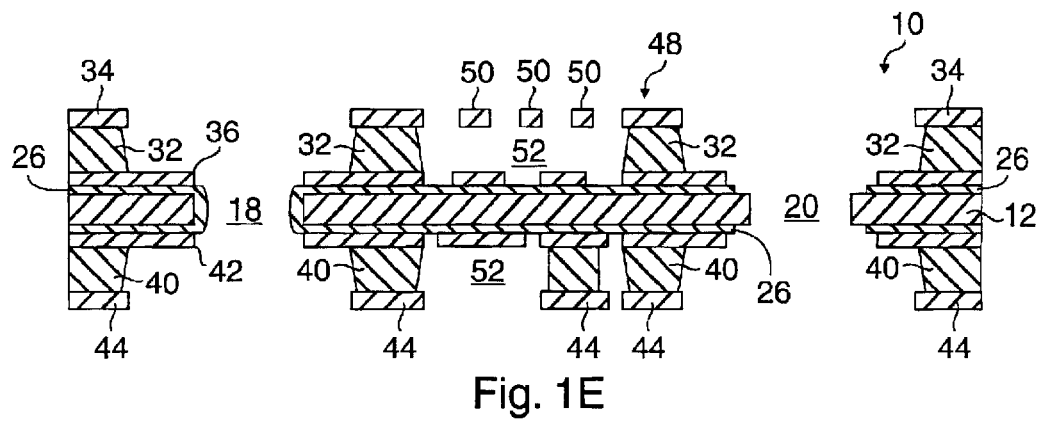

CIRCUIT BOARD AND A METHOD FOR MAKING THE SAME

This application claims benefit of 60/207,647 filed May 26, 2000.

(1) Field of the Invention

The present invention relates to an electronic circuit board and a method for making an electronic circuit board and more particularly, to a multi-layer electronic circuit board having metallized apertures which are selectively isolated and/or disconnected from an electrical ground plane, having selectively formed air bridges and/or crossover circuits, and further having selectively formed interconnection apertures.

(2) Background of the Invention

Multi-layer circuit boards operatively receive electronic components and allow the received components to be desirably interconnected to selectively and cooperatively form electronic circuits. Particularly, these components are operatively received upon opposed board surfaces and within certain interior portions of the board, thereby desirably allowing each of the electronic circuit boards to contain a relatively large amount of components which efficiently and densely populate the respective boards.

It is desirable to allow each of the component containing surfaces or portions of a created and/or formed electronic circuit board to communicate and/or be selectively interconnected, thereby allowing the contained electronic components to cooperatively and selectively form a relatively large number of desired electronic circuits. This desired communication and/or interconnection typically requires the use of shared electrical ground planes, the transmittal of electrical power and/or control type signals between some or all of the component containing surfaces or board portions, and/or the connection of components on each of the opposed surfaces and/or within and between certain of the interior portions and the top and/or bottom and/or other board surfaces.

This desired interconnection typically requires that one or more holes be formed or drilled through each of the circuit boards, thereby creating at least one "through hole" or "via" traversing between each of the opposed component containing surfaces and through the various interior circuit board portions. Typically this drilling process is relatively complex and time consuming, thereby increasing the overall circuit board production cost. This drilling process also undesirably damages and/or destroys many of the circuit boards, thereby further increasing overall production costs.

Further, it is desirable to form "air-bridges" or "crossover type circuits" upon one or more selected surfaces and/or within certain component containing portions of the formed circuit board in order to allow multiple levels of circuits and/or electrical interconnections to be formed upon a single board surface and/or within a certain component containing portion of the circuit board, thereby desirably increasing the amount of electronic circuits which may be created upon and/or within the created circuit board (e.g., increasing the density of the contained electronic circuitry).

These "air-bridges" or crossover circuits are typically formed by rather complicated, costly, and time consuming processes. The formed bridges and crossover circuits further do not typically and efficiently accommodate certain desirable circuit board interconnection processes, techniques, and/or methodologies such as and without limitation, the use of relatively heavy wire bonding (e.g., aluminum wire having a diameter of about five to about twenty millimeters) or the direct connection of components to a surface of the board.

Further, it is desirable to increase the relative density of a circuit board interconnections upon one or more selected surfaces of a formed circuit board in order to allow for a relatively wider range of available circuit board connection strategies and/or a relatively wider range of "microchip-to-circuit-board" connection strategies within a relatively smaller region and/or area upon one or more selected surfaces of a formed circuit board.

There is therefore a need to provide an electronic circuit board and a method for producing a multi-layer electronic circuit board which overcomes some or all of the previously delineated drawbacks of prior electronic circuit boards and methods for making a circuit board, which selectively allows grounded and non-ground "vias" to be desirably and selectively and efficiently formed in a cost effective manner, and which further allows for the efficient and selective formation of air-bridge members or crossover circuits which desirably accommodate diverse types of circuit interconnection processes, and which further allows for the formation of multiple surface interconnection apertures which increase the density of interconnection surfaces upon one or more surfaces of the formed electronic circuit board.

SUMMARY OF THE INVENTION

It is a first object of the present invention to provide an electronic circuit board and a method for producing an electronic circuit board which overcomes some or all of the previously delineated drawbacks of prior multi-layer electronic circuit boards and of prior electronic circuit board forming methodologies and techniques.

It is a second object of the invention to provide a method for producing a multi-layer electronic circuit board which overcomes some or all of the previously delineated drawbacks of prior multi-layer electronic circuit board forming methodologies and techniques, which allows for the formation or creation of an electronic circuit board which selectively receives various electronic components, which allows for the selective, efficient, and reliable formation of metallized apertures, within the formed and/or created electronic circuit board, which cooperatively allow for communication by and between these various electronic components and which further cooperatively allow for the selective interconnection of these contained components.

It is a third object of the invention to provide a method for producing a multi-layer electronic circuit board which overcomes some or all of the previously delineated drawbacks of prior multi-layer electronic circuit board forming methodologies and techniques and which allows for the selective formation of metallized apertures within a circuit board, which may be selectively connected or disconnected and/or selectively isolated from a formed electrical ground plane or bus.

It is a fourth object of the invention to provide a method for producing a multi-layer electronic circuit board which overcomes some or all of the previously delineated drawbacks of prior multi-layer electronic circuit board forming methodologies and techniques and which allows for the selective and efficient formation of air bridges and/or crossover circuits and/or crossover members of the type which are adapted to accommodate a wide variety of component interconnection assemblies, techniques, and/or methodologies.

It is a fifth object of the present invention to provide for a method for producing a multi-layer circuit electronic circuit board which overcomes some or all of the previously delineated drawbacks of prior multi-layer electronic circuit board forming methodologies and techniques and which allows for the selective and efficient formation of interconnection apertures and/or densely arranged surface circuit interconnections of the type which are adapted to accommodate a wide variety of component attachment and connection assemblies, techniques, and/or methodologies.

According to a first aspect of the present invention, an circuit board is provided. The circuit board comprises a first electrically conductive member having a first and a second surface, having a first aperture with a first interior surface, and having a second aperture with a second interior surface; adhesive material which is applied upon certain portion of the first and second surfaces, and which is applied upon the first interior surface of the first aperture; a first circuit assembly having at least a second electrically conductive member which is coupled to the adhesive material resident upon the first surface of the first electrically conductive member, the first circuit assembly further including at least a third electrically conductive member and a first core member which is contained between at least the second and at least the third electrically conductive members and which includes at least one air-bridge; a second circuit assembly having at least a fourth electrically conductive member which is coupled to the adhesive material resident upon the second surface of the first electrically conductive member, the second circuit assembly further including at least a fifth electrically conductive member and a second core member which is contained between a least the fourth and at least the fifth electrically conductive members; a layer of dielectric material which is applied to at least the first circuit assembly; and at least a sixth electrically conductive member which is disposed within the layer of dielectric material.

According to a second aspect of the invention, a method for making an circuit board is provided. The method includes the steps of providing a first electrically conductive member; providing a first assembly having a core member upon which a second electrically conductive member is disposed; forming at least one aperture within the first electrically conductive member, the at least one aperture having a first interior surface; placing the dielectric material upon the first interior surface and upon the first electrically conductive member; coupling the second electrically conductive member to the layer of dielectric material; removing a portion of the core member, thereby forming at least one electrically conductive air bridge by use of the second electrically conductive member; placing a second layer of the dielectric material upon the first assembly; placing a third electrically conductive member upon the second layer of the dielectric material; and coupling the third electrically conductive member to the at least one air-bridge, thereby forming a circuit board.

These and other objects, aspects, and advantages of the present invention will become apparent upon reading the following detailed description in combination with the accompanying drawings.

BRIEF DESCRIPTION OF THE DRAWINGS

FIGS. 1(a)–(k) are successive sectional side views of a multi-layer circuit board being produced and/or formed in accordance with the teachings of the preferred embodiment of the invention.

DETAILED DESCRIPTION OF THE PREFERRED EMBODIMENT OF THE INVENTION

Figure 1F:
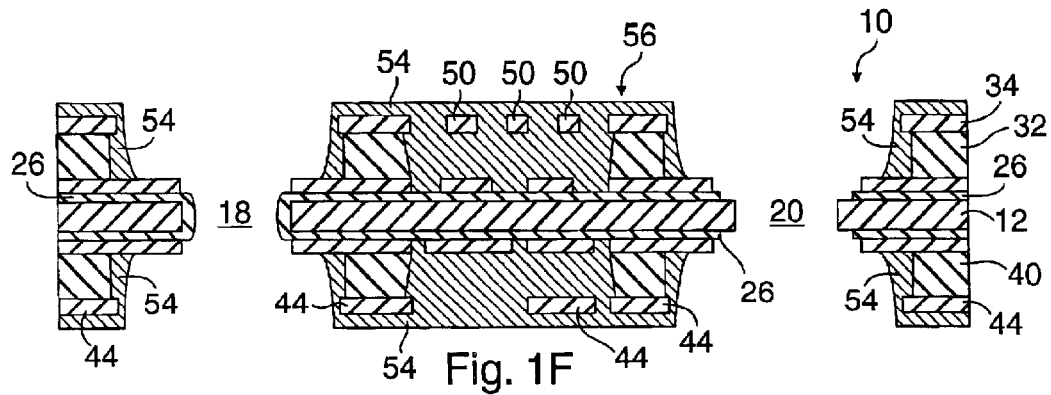

Referring now to FIGS. 1(a)–(k), there is shown a method and/or process 10 for selectively forming a multilayer electrical circuit board in accordance with the teachings of the preferred embodiment of the invention. Specifically, as shown best in FIG. 1(a), the circuit board formation or creation process 10 begins with the acquisition of a member 12 having a top surface 14 and a bottom surface 16. Member 12 is selectively immersed in a conventional and commercially available etchant material, effective to create apertures and/or perforations 18, 20 through core member 12 having respective interior surfaces 22, 24 formed by portions of the member 12. In one non-limiting embodiment, member 12 comprises an electrically conductive member such as copper or some other electrically conductive metal. The selectively created apertures 18, 20 are therefore "metallized". That is, apertures 18, 20 are formed within metal core member 12 and therefore respectively contain and/or include electrically conductive interior surfaces 22, 24. As will be further delineated below, apertures 18 and 20 cooperatively and selectively allow for the creation of a "vias" or "perforations" within the metal core member 12.

The second step of process 10, as shown best in FIG. 1(b), requires that a certain commercially available dielectric liquid adhesive material 26 be respectively placed upon substantially all of the top surface 14 of metal foil member 12, upon substantially all portions of the bottom surface 16 of metal foil member 12, and upon aperture surface 22 by a conventional process, thereby creating pre-circuit assembly 28. Surface 24 and those portions of respective surfaces 14, 16 proximate to aperture 20 do not receive the material 26.

In the third step of process 10, as shown best in FIG. 1(c), a pre-circuit assembly 30 is provided and/or created. Particularly, pre-circuit assembly 30 includes a core portion 32 having certain portions 34 and 36 respectively disposed upon the top and bottom surfaces 33, 35. In one non-limiting embodiment of the invention, core portion 32 comprises a conventional and commercially available material such as aluminum. In a further nonlimiting embodiment of the invention, members 34, 36 comprise a conventional and commercially available electrically conductive material such as copper. In yet a further non-limiting embodiment of the invention, member 32 may be encapsulatively contained within portions 34, 36 and some of these various portions may be selectively and etchably removed, in a known manner, to form the assembly 30.

As shown in FIG. 1(d), process 10 continues by providing a second pre-circuit assembly 38 which, in one non-limiting embodiment of the invention, is substantially similar to pre-circuit assembly 30. Particularly, pre-circuit assembly 38 includes a core portion 40 having certain portions 42 and 44 respectively disposed upon the top and bottom surfaces 41, 43. In one non-limiting embodiment of the invention, core portion 40 comprises a conventional and commercially available metal such as aluminum. In a further non-limiting embodiment of the invention, members 42, 44 comprise a conventional and commercially available electrically conductive material such as copper.

As further shown in FIG. 1(d), pre-circuit assembly 28 is selectively "grown" as additional layers are selectively added to the electronic circuit board assembly or pre-circuit assembly 28. That is, as shown in FIG. 1(d), process 10 continues by attaching pre-circuit assemblies 30, 38 to pre-circuit assembly 28, thereby forming pre-circuit assembly 46. Particularly, members 36 of pre-circuit assembly 30 are attached, connected, and/or otherwise coupled to material 26 residing upon the top surface 14 of member 12, and members 42 of pre-circuit assembly 38 are attached, connected, and/or otherwise coupled to the material 26 residing upon the bottom surface 16 of member 12. In this manner, members 32, 40 of pre-circuit assemblies 30, 38 cooperatively overlay apertures 18, 20, thereby forming pre-circuit assembly 46.

In the fifth step of the process 10, which is best shown in FIG. 1(e), pre-circuit assembly 46 is selectively immersed in an etchant material (e.g., an aluminum etchant material) which removes portions of members 32, 40 of each of pre-circuit assembly 30, 38, thereby creating pre-circuit assembly 48 having selectively formed and electrically conductive air-bridges 50 (i.e., each air-bridge 50 is formed from or comprises one of the electrically conductive members 34), selectively formed cavity 52, and apertures 18, 20 which traverse the formed assembly 48 and, more particularly, through core member 32 and core members 40 of circuit assemblies 30, 48, thereby adding additional layers to the previously formed pre-circuit assembly 28 and lengthening the apertures 18, 20.

In the sixth step of process 10, as shown best in FIG. 1(f), a conventional and commercially available dielectric material 54 is selectively applied to pre-circuit 48. In one non-limiting embodiment, a layer of dielectric material 54 covers the first pre-circuit assembly 30 and a second layer of dielectric material covers the second pre-circuit assembly 38. The dielectric material 54 is not received within the apertures 18 or 20. Dielectric material 54 substantially fills apertures 52, thereby operatively supporting air-bridges 50 and forming pre-circuit assembly 56. In one non-limiting embodiment of the invention, dielectric material 54 may comprise a photosensitive material or alternately dielectric material 54 may comprise a non-photo-imageable material.

Figure 1G:
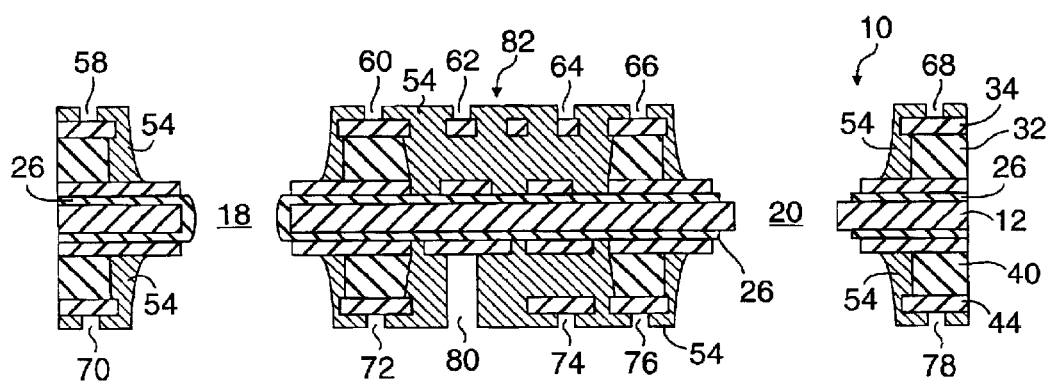

In the eighth step of process 10, which is shown best in FIG. 1(g), certain portions at dielectric material 54 are removed from pre-circuit assembly 56, effective to form recesses 58, 60, 82, 64, 63, 68 which terminate upon a unique one of the members 34, recesses 70, 72, 74, 76, 78, which terminate upon a unique one of the members 44, and recess 80, which terminates upon member 42, thereby forming pre-circuit assembly 82. In one non-limiting embodiment, recesses 58–78 are formed by a known conventional photoimaging process (e.g., when the dielectric material 54 which is applied in the sixth step of process 10 which is shown in FIG. 1(f), comprises a photo-imagable and/or photosensitive material, recesses 58–78 may be formed by a known conventional photoimaging process). In a further non-limiting embodiment of the invention, recesses 58–78 are formed by a known conventional laser drilling process (e.g., when the dielectric material 54 which is applied in the sixth step of process 10 which is shown best in FIG. 1(f), comprises a non-photo-imagable material, recesses 58–78 may be formed by a known conventional laser driller process).

Figure 1H:
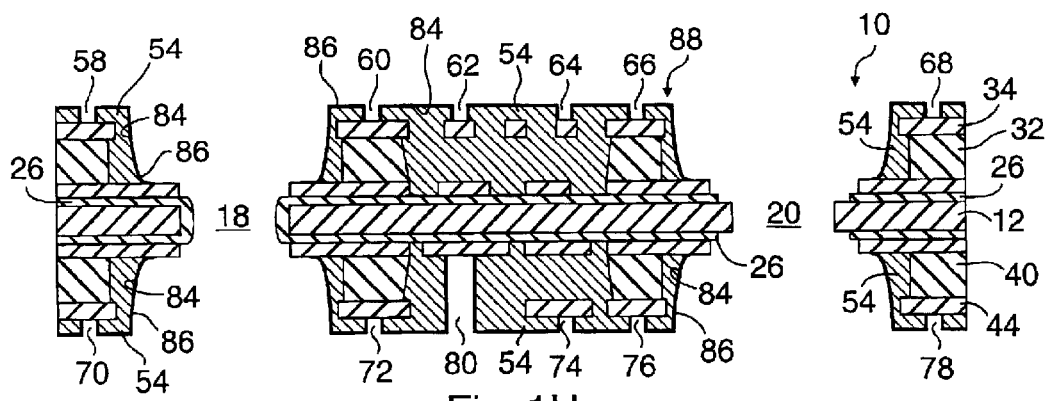

In the ninth step of process 10, which is shown best in FIG. 1(h), a conditioner 84 is applied to the exposed surfaces of dielectric material 54 residing within apertures 58–78 and upon the dielectric material 54 residing upon pre-circuit assembly 82, effective to "condition" the dielectric material 54 for "metallization". A certain material 86 is then applied upon the exposed, "conditioned" surfaces of dielectric material 54 residing within apertures 58–78 and upon pre-circuit assembly 82, effective to "metallize" the dielectric material 54, thereby forming pre-circuit assembly 88. It should be appreciated that the application of conditioner 84 to material 54 creates "micro-holes" and/or "micro-apertures" within the surface of material 54. These created "micro-apertures" substantially allow for material 86 to adhere to and substantially "metallize" the previously conditioned dielectric material 54, thereby preparing pre-circuit assembly 88 for an electroplating process, which is delineated more fully below.

Figure 1I:
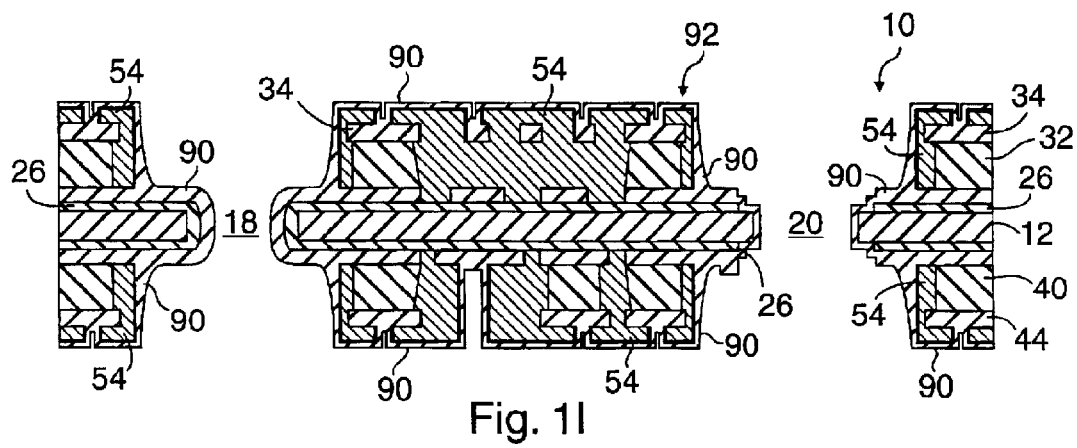

In the tenth step of process 10, which is shown best in FIG. 1(i), a certain electrically conductive material 90 is selectively applied to pre-circuit assembly 88 effective to "coat" and/or otherwise "cover" pre-circuit assembly 88 with a layer of electrically conductive material 90, thereby forming pre-circuit assembly 92. In one non-limiting embodiment of the invention, electrically conductive material 90 comprises a metal such as copper. In a further non-limiting embodiment of the invention, material 90 is applied upon pre-circuit assembly 88 by a known conventional electroplating process.

Figure 1J:
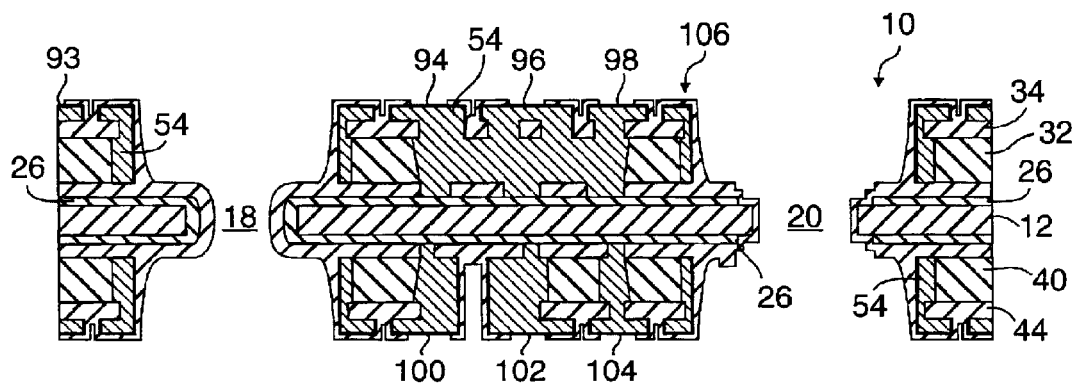

In the eleventh step of process 10, which is shown best in FIG. 1(j), a selective "pattern" is created and/or "printed" upon selected portions of material 90 in a known and conventional manner. That is, a certain etchant material (e.g., a copper etchant) is selectively applied to certain selected portions of material 90, effective to remove those certain portions of the material 90 to which the etchant is applied and exposing certain surfaces 93, 94, 96, 98, 100, 102, and 104 of material 54, thereby forming pre-circuit assembly 106.

Figure 1K:
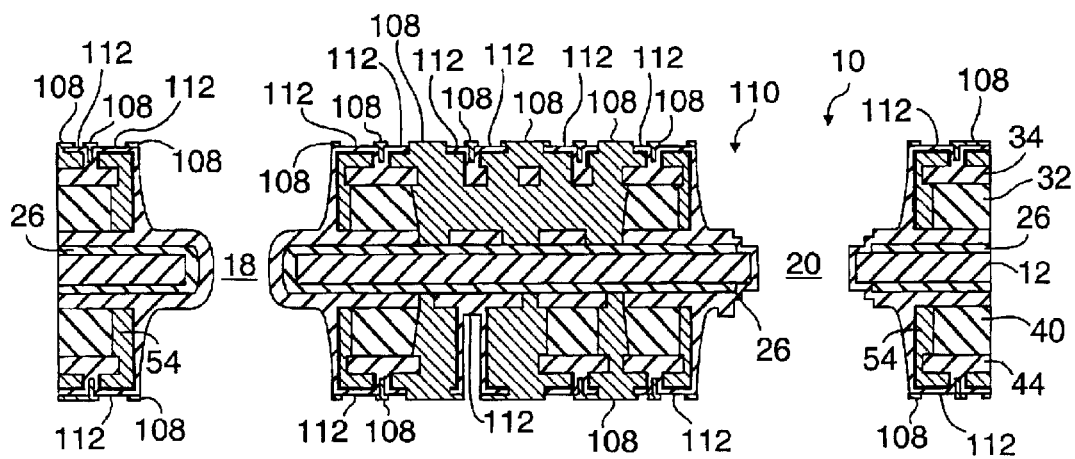
Figure 2A:
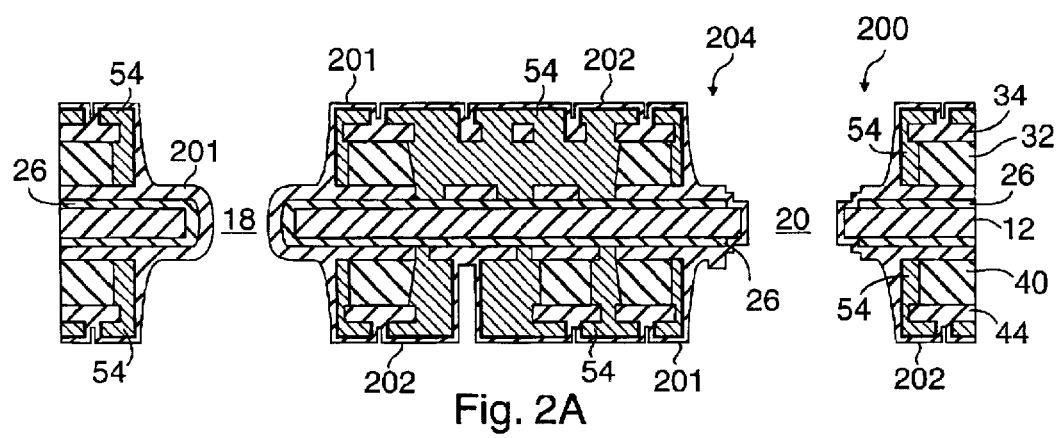
FIGS. 2(a)–(b) are successive sectional side views of a multi-layer circuit board being produced and/or formed in accordance with the teachings of the second embodiment of the invention.
Figure 2B:
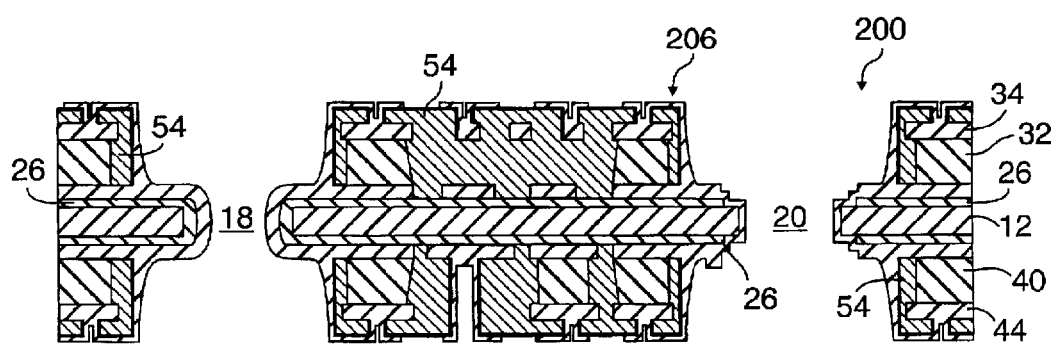

In an alternative non-limiting embodiment of the invention, which is best shown in FIGS. 2(a) and 2(b), pre-circuit assembly 88 may be processed according to the method and/or steps of process 200 instead of the process steps of process 10 which are shown best in FIG. 1(i) and 1(g) and which have been previously delineated. Process 200 begins, as shown best in FIG. 2(a), by applying a conventional and commercially available photoimagable and photoresistive material 201 to certain portions of pre-circuit assembly 200 and applying a layer of electrically conductive material 202 to other portions of pre-circuit assembly 88, thereby forming pre-circuit assembly 204. In this non-limiting embodiment, electrically conductive material 202 comprises a conventional and commercially available copper material which is applied to pre-circuit assembly 88 by a known and conventional electroplating process. In the second step of process 200, shown best in FIG. 2(b), after electrically conductive material 202 is applied to the pre-circuit assembly 88, the photoresist material 201 is removed from pre-circuit assembly 204 and the metallization layer 86 is selectively exposed to a certain etchant material (e.g., metallization layer etchant), thereby removing exposed portions of metallization material 86 and forming pre-circuit assembly 206. It should be appreciated that pre-circuit assembly 204 may be processed in accordance with the remaining process step of process 10 which are shown best in FIG. 1(k).

In the twelfth step of process 10, which is shown best in FIG. 1(k), a certain "solder mask" material 108 is selectively applied upon certain selective portions of material 90, effective to "fill" the apertures 58–78 and substantially overlay certain selective portions of material 90, thereby forming a circuit board assembly 110.

It should be appreciated that pre-circuit assembly 110 includes certain exposed portions 112 of material 90 which form external surface interconnections and/or circuit interface interconnections which cooperatively allow for the formed circuit board assembly to be easily and efficiently connected or interconnected to other certain circuitry, electronic components, "micro BGA type component/circuits", and/or "flip chips" to allow for multiple circuit and/or electronic component interconnection/connection strategies. That is, material 90 is physically and electrically coupled to electrically conductive air-bridges 50 and to member 34, thereby allowing components or elements which are external to the circuit board assembly 110 to be easily coupled to the assembly 110 and to various contained components or elements within the assembly 110. It should further be appreciated that process 10 concomitantly produces electroplated apertures 18, 20 which may be non-grounded (e.g., the dielectric material 26 resident within aperture 18 substantially isolates a component, element, and/or conductor which is selectively placed within aperture 18 from member 12 which comprises an electrical ground plane and/or is coupled to an electrical ground potential) or grounded (e.g., interior surface 24 includes member 12 which comprises an electrical ground plane and/or is coupled to an electrical ground potential). It should further be appreciated that process 10 concomitantly produces and/or forms air-bridges 50 which allow for increased component interconnection between circuit layers.

It should be understood that the invention is not limited to the exact embodiment or construction which has been illustrated and described but that various changes may be made without departing from the spirit and the scope of the invention.

What is claimed is:

1. A circuit board comprising:
   a first electrically conductive member having a first and a second surface, having a first aperture with a first interior surface, and having a second aperture with a second interior surface;
   adhesive material which is applied upon certain portion of said first and second surfaces, and which is applied upon said first interior surface of said first aperture;
   a first circuit assembly having at least a second electrically conductive member which is coupled to said adhesive material resident upon said first surface of said first electrically conductive member, said first circuit assembly further including at least a third electrically conductive member and a first core member which is contained between at least said second and at least said third electrically conductive members and which includes at least one air-bridge;
   a second circuit assembly having at least a fourth electrically conductive member which is coupled to said adhesive material resident upon said second surface of said first electrically conductive member, said second circuit assembly further including at least a fifth electrically conductive member and second core member which is contained between at least said fourth and at least said fifth electrically conductive members;
   a layer of dielectric material which is applied to at least said first circuit assembly; and
   at least a sixth electrically conductive member which is disposed within said layer of dielectric material.

2. The circuit board of claim 1 wherein said at least a sixth electrically conductive member is coupled to said at least one air-bridge of said first circuit assembly.

3. The circuit board of claim 2 wherein said at least a sixth electrically conductive member is coupled to said at least a third electrically conductive member of said first circuit assembly.

4. The circuit board of claim 3 wherein a portion of solder mask material is disposed upon at least a portion of said at least a sixth electrically conductive member.

5. The circuit board of claim 1 wherein said first electrically conductive member is formed from copper.

6. The circuit board of claim 1 wherein said first electrically conductive member comprises an electrical ground plane.

7. A method for making a circuit board comprising the steps of:
   providing a first electrically conductive member;
   providing a first assembly having a core member upon which a second electrically conductive member and a third electrically conductive member is disposed;
   forming at least one aperture within said first electrically conductive member, said at least one aperture having a first interior surface;
   placing a first layer of dielectric material upon said first interior surface and upon said first electrically conductive member;
   coupling said third electrically conductive member to said first layer of dielectric material;
   removing a portion of said core member, thereby forming at least one electrically conductive air bridge by use of said second electrically conductive member;
   placing a second layer of dielectric material upon said first assembly;
   placing a fourth electrically conductive member upon said second layer of dielectric material; and
   coupling said third electrically conductive member to said at least one air-bridge, thereby forming a circuit board.

8. The method of claim 7 wherein said first electrically conductive member is formed from copper.

9. The method of claim 7 further comprising the step of forming a second aperture having a second interior surface within said first electrically conductive member.

10. The method of claim 9 further comprising the step of coupling said first electrically conductive member to a source of electrical ground potential.

11. The method of claim 7 further comprising the steps of:
    providing a second assembly having a core member upon which a fifth electrically conductive member is disposed;
    coupling said fifth electrically conductive member upon said first layer of dielectric material resident upon said first electrically conductive member;
    placing a third layer of said dielectric material upon said second assembly;
    forming an aperture within said third layer of dielectric material which terminates upon said fifth electrically conductive member; and
    electroplating said aperture.

12. A method for making a circuit board comprising the steps of:
    providing a first electrically conductive member having a first and a second surface;
    forming a first aperture within said first electrically conductive member having a first interior surface;
    forming a second aperture within said first electrically conductive member having a second interior surface;
    selectively applying a dielectric material to said first and second surfaces of said first electrically conductive member and to said first interior surface of said first aperture, thereby forming a first pre-circuit assembly;
    providing a second pre-circuit assembly having a first core member including a first surface and a second surface, said second pre-circuit assembly further having at least one second electrically conductive member disposed upon said first surface of said first core member and having at least one third electrically conductive member disposed upon said second surface of said first core member;
    providing a third pre-circuit assembly having a second core member including a first surface and a second surface, said third pre-circuit assembly having at least one fourth electrically conductive member disposed upon said first surface of said second core member and having at least one fifth electrically conductive member disposed upon said second surface of said core member;
    selectively attaching said second pre-circuit assembly to said first pre-circuit assembly by attaching said at least one third electrically conductive member to said dielectric material which is resident upon said first surface of said first electrically conductive member;

selectively attaching said third pre-circuit assembly to said first pre-circuit assembly by attaching said at least one fourth electrically conductive member to said dielectric material which is resident upon said second surface of said first electrically conductive member;

selectively applying a certain etchant material to said first and second core members, effective to remove certain portions of said first and second core members, thereby forming at least one first air-bridge within said second pre-circuit assembly and at least one second air-bridge within said third pre-circuit assembly;

applying a second dielectric material upon said second and third pre-circuit assemblies, effective to cover said at least one second, at least one third, at least one fourth, and at least one fifth electrically conductive members and to underfill said at least one air-bridge and said at least one second air-bridge;

forming apertures by selectively removing certain portions of said solder mask second dielectric material, wherein said apertures selectively expose certain portions of said at least one second, at least one second, at least one fourth, and at least one fifth electrically conductive members and said at least one first air-bridge and said at least one second air bridge;

placing an electrically conductive material upon said first, second and third pre-circuit assemblies, thereby covering portions of said dielectric material which reside within said first aperture and portions of said first electrically conductive member which reside within said second aperture, covering said second dielectric material, and covering said certain exposed portions of said at least one second, at least one fourth, and at least one fifth electrically conductive members;

selectively removing certain portions of said electrically conductive material which reside upon said second dielectric material, thereby exposing a certain portion of said second dielectric material; and selectively applying a solder mask material upon said second dielectric and upon certain portions of said electrically conductive material, thereby forming a circuit board assembly.

13. The method of claim 12 wherein said first electrically conductive member and said at least one second, at least one third, at least one fourth, and at least one fifth electrically conductive members comprise copper material.

14. The method of claim 12 wherein said first and second core members comprise aluminum.

15. The method of claim 12 wherein said step of placing said electrically conductive material upon said first, second, and third pre-circuit assemblies comprises electroplating copper upon said first, second and third pre-circuit assemblies.

16. The method of claim 12 wherein said solder mask second dielectric material structurally supports said at least one air-bridge.

17. The method of claim 12 wherein said step of forming apertures by selectively removing certain portions of said second dielectric material comprises forming at least one aperture within said second dielectric material and the step of placing a certain electrically conductive material upon said first, second, and third pre-circuit assemblies comprises applying said electrically conductive material within said at least one aperture within said second dielectric material.

18. The method of claim 17 wherein said step of applying a solder mask material comprises applying said solder mask material within said apertures within said second dielectric material.

* * * * *